(12) United States Patent
Kang

(10) Patent No.: US 12,666,616 B2
(45) Date of Patent: Jun. 23, 2026

(54) NONVOLATILE MEMORY DEVICE WITH INTEGRATED BACKGATE AND METHOD OF MANUFACTURING

(71) Applicant: SK hynix Inc., Icheon-si (KR)

(72) Inventor: In Ku Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 621 days.

(21) Appl. No.: 18/101,530

(22) Filed: Jan. 25, 2023

(65) Prior Publication Data

US 2024/0049465 A1 Feb. 8, 2024

(30) Foreign Application Priority Data

Aug. 5, 2022 (KR) ......................... 10-2022-0098171

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/30* (2023.02);
(Continued)

(58) Field of Classification Search
None
See application file for complete search history.

(56) References Cited

U.S. PATENT DOCUMENTS

2016/0163729 A1* 6/2016 Zhang ..................... H10B 41/35
257/324
2019/0027493 A1* 1/2019 Kimura .................. H10D 99/00
(Continued)

FOREIGN PATENT DOCUMENTS

KR 101946179 B1 2/2019
KR 1020210015078 A 2/2021
(Continued)

OTHER PUBLICATIONS

Jae-Min Sim et al., Gate All around with Back Gate NAND Flash Structure for Excellent Reliability Characteristics in Program Operation, Electronics 2021, 10, 1828. https://doi.org/10.3390/electronics101518, MDPI, Basel, Switzerland.

*Primary Examiner* — Julio J Maldonado
*Assistant Examiner* — Jason Mcdonald
(74) *Attorney, Agent, or Firm* — WILLIAM PARK AND ASSOCIATES LTD.

(57) ABSTRACT

Provided herein are a semiconductor memory device and a method of manufacturing the semiconductor memory device. The semiconductor memory device includes a gate stacked body including a plurality of interlayer insulating layers and a plurality of conductive layers that are alternately stacked, wherein a top-most conductive layer, among the plurality of conductive layers, corresponds to a backgate line and the rest of the plurality of conductive layers correspond to word lines, and a vertical channel structure passing through the gate stacked body. A first part of the vertical channel structure passing through the plurality of interlayer insulating layers and the plurality of conductive layers corresponding to the word lines has a circular structure in a plan view, and a second part of the vertical channel structure passing through the conductive layer corresponding to the backgate line has a pair of semicircular structures that are separated from each other in a plan view.

10 Claims, 28 Drawing Sheets

(51) Int. Cl.

| | | |
|---|---|---|
| *H10B 41/27* | (2023.01) | |
| *H10B 41/30* | (2023.01) | |
| *H10B 41/50* | (2023.01) | |
| *H10B 43/10* | (2023.01) | |
| *H10B 43/30* | (2023.01) | |
| *H10B 43/50* | (2023.01) | |
| *H10B 63/00* | (2023.01) | |

(52) U.S. Cl.
CPC ............. *H10B 41/50* (2023.02); *H10B 43/10* (2023.02); *H10B 43/30* (2023.02); *H10B 43/50* (2023.02); *H10B 63/34* (2023.02)

(56) References Cited

U.S. PATENT DOCUMENTS

| | | | |
|---|---|---|---|
| 2020/0098784 A1* | 3/2020 | Nagashima | ....... H01L 21/31116 |
| 2021/0036011 A1* | 2/2021 | Son | ......................... G11C 8/14 |

FOREIGN PATENT DOCUMENTS

| | | | |
|---|---|---|---|
| KR | 1020210158289 A | 12/2021 | |
| KR | 1020220028776 A | 3/2022 | |
| KR | 1020220036208 A | 3/2022 | |
| KR | 1020220052684 A | 4/2022 | |
| KR | 1020220057049 A | 5/2022 | |

* cited by examiner

NONVOLATILE MEMORY DEVICE WITH INTEGRATED BACKGATE AND METHOD OF MANUFACTURING

CROSS-REFERENCE TO RELATED APPLICATION

The present application claims priority under 35 U.S.C. § 119(a) to Korean patent application number 10-2022-0098171, filed on Aug. 5, 2022, in the Korean Intellectual Property Office, the entire disclosure of which is incorporated herein by reference.

BACKGROUND

1. Technical Field

Various embodiments of the present disclosure relate to an electronic device, and more particularly to a semiconductor memory device of a vertical channel structure and a method of manufacturing the semiconductor memory device.

2. Related Art

Recently, the paradigm for a computer environment has been converted into ubiquitous computing so that computer systems can be used anytime and anywhere. Due to this, the use of portable electronic devices, such as mobile phones, digital cameras, and notebook computers has rapidly increased. In general, such portable electronic devices use a memory system which employs a semiconductor memory device, in other words, use a data storage device. The data storage device is used as a main memory device or an auxiliary memory device for portable electronic devices.

A data storage device using a semiconductor memory device is advantageous in that, since there is no mechanical driving part, stability and durability are excellent, an information access speed is high, and power consumption is low. The data storage device, as examples of the memory system having such advantages, includes a universal serial bus (USB) memory device, memory cards having various interfaces, a solid state drive (SSD), etc.

Semiconductor memory devices are classified into a volatile memory device and a nonvolatile memory device.

Such a nonvolatile memory device has relatively low write and read speeds, but retains data stored therein even when the supply of power is interrupted. Therefore, the nonvolatile memory device is used to store data to be retained regardless of whether power is supplied. Examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

Semiconductor memory devices include memory cells which are configured to store data. To increase the degree of integration of the memory cells, a three-dimensional semiconductor memory device has been proposed.

The three-dimensional semiconductor memory device includes memory cells arranged in three dimensions. The degree of integration of the three-dimensional semiconductor memory device may be improved as the number of stacked memory cells is increased. As the number of the stacked memory cells increases, technology capable of improving the structural stability of the three-dimensional semiconductor memory device is required.

SUMMARY

An embodiment of the present disclosure may provide for a semiconductor memory device. The semiconductor memory device may include a gate stacked body including a plurality of interlayer insulating layers and a plurality of conductive layers that are alternately stacked, wherein a top-most conductive layer, among the plurality of conductive layers, corresponds to a backgate line and the rest of the plurality of conductive layers correspond to word lines, and a vertical channel structure passing through the gate stacked body, wherein a first part of the vertical channel structure passing through the plurality of interlayer insulating layers and the plurality of conductive layers corresponding to the word lines has a circular structure in a plan view, and a second part of the vertical channel structure passing through the conductive layer corresponding to the backgate line has a pair of semicircular structures that are separated from each other in a plan view.

An embodiment of the present disclosure may provide for a method of manufacturing a semiconductor memory device. The method may include forming a stack in which a plurality of first material layers and a plurality of second material layers are alternately disposed on a base, forming a channel hole that passes through the stack, and sequentially forming a memory layer, a channel layer, a backgate insulating layer, and a backgate on a sidewall of the channel hole, thereby forming a vertical channel structure, performing an etching process such that an upper surface of the backgate is arranged at a position lower than that of an uppermost second material layer among the plurality of second material layers, and forming a first gap insulating layer in a region where the backgate is etched, forming a line-shaped trench that exposes the upper surface of the backgate and overlaps the vertical channel structure and the stack, thereby separating an upper end of the vertical channel structure into a first portion and a second portion each having a semicircular structure, forming a second gap insulating layer that contacts a surface of the channel layer that is exposed by the trench, forming, on a lower surface of the trench, a third material layer that contacts the upper surface of the backgate and the uppermost second material layer, forming a slit that passes through the stacked body, and then removing the plurality of second material layers and the third material layer that are exposed through the slit, and filling a recessed area from which the plurality of second material layers and the third material layer are removed with a conductive material, thereby forming a conductive layer corresponding to a backgate line and a plurality of conductive layers corresponding to word lines.

An embodiment of the present disclosure may provide for a method of manufacturing a semiconductor memory device. The method may include forming a stack in which a plurality of first material layers and a plurality of second material layers are alternately disposed on a base, forming a channel hole that passes through the stack, and sequentially forming a memory layer, a channel layer, a backgate insulating layer, and a backgate on a sidewall of the channel hole, thereby forming a vertical channel structure, performing an etching process such that an upper surface of the backgate is arranged at a position that is equal to or higher than that of an uppermost second material layer, among the plurality of second material layers, and forming a first gap insulating layer in a region where the backgate is etched, forming a slit which that passes through the stack, and then performing a replacement process to replace the plurality of second material layers with a conductive layer corresponding to a backgate and a plurality of conductive layers corresponding to word lines, etching a portion of the channel layer that is exposed through the trench, forming a second gap insulating layer on a surface of the channel layer that is exposed through the trench, filling a lower surface of the trench with a conductive material to form a connection pattern that connects the conductive layer corresponding to the backgate and the upper surface of the backgate.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure are directed to a semiconductor memory device which is high in vertical height and is improved in electrical characteristics, and a method of manufacturing the semiconductor memory device.

Figure 1:
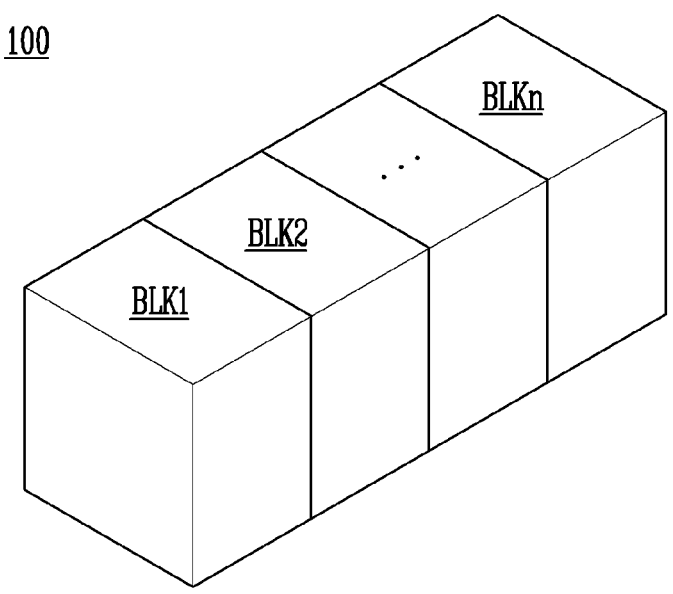
FIG. 1 is a diagram illustrating a semiconductor memory device according to an embodiment of the present disclosure.

FIG. 1 is a diagram illustrating a semiconductor memory device according to an embodiment of the present disclosure.

Referring to FIG. 1, the semiconductor memory device 100 may include a plurality of memory blocks BLK1 to BLKn.

Each of the memory blocks BLK1 to BLKn may include a source line, bit lines, memory cell strings that are electrically connected to the source line and the bit lines, word lines that are electrically connected to the memory cell strings, and select lines that are electrically connected to the memory cell strings. Each of the memory cell strings may include memory cells and select transistors which may be connected in series to each other by a channel pattern. The select lines and the word lines may be used as gate electrodes of select transistors and memory cells.

Figure 2:
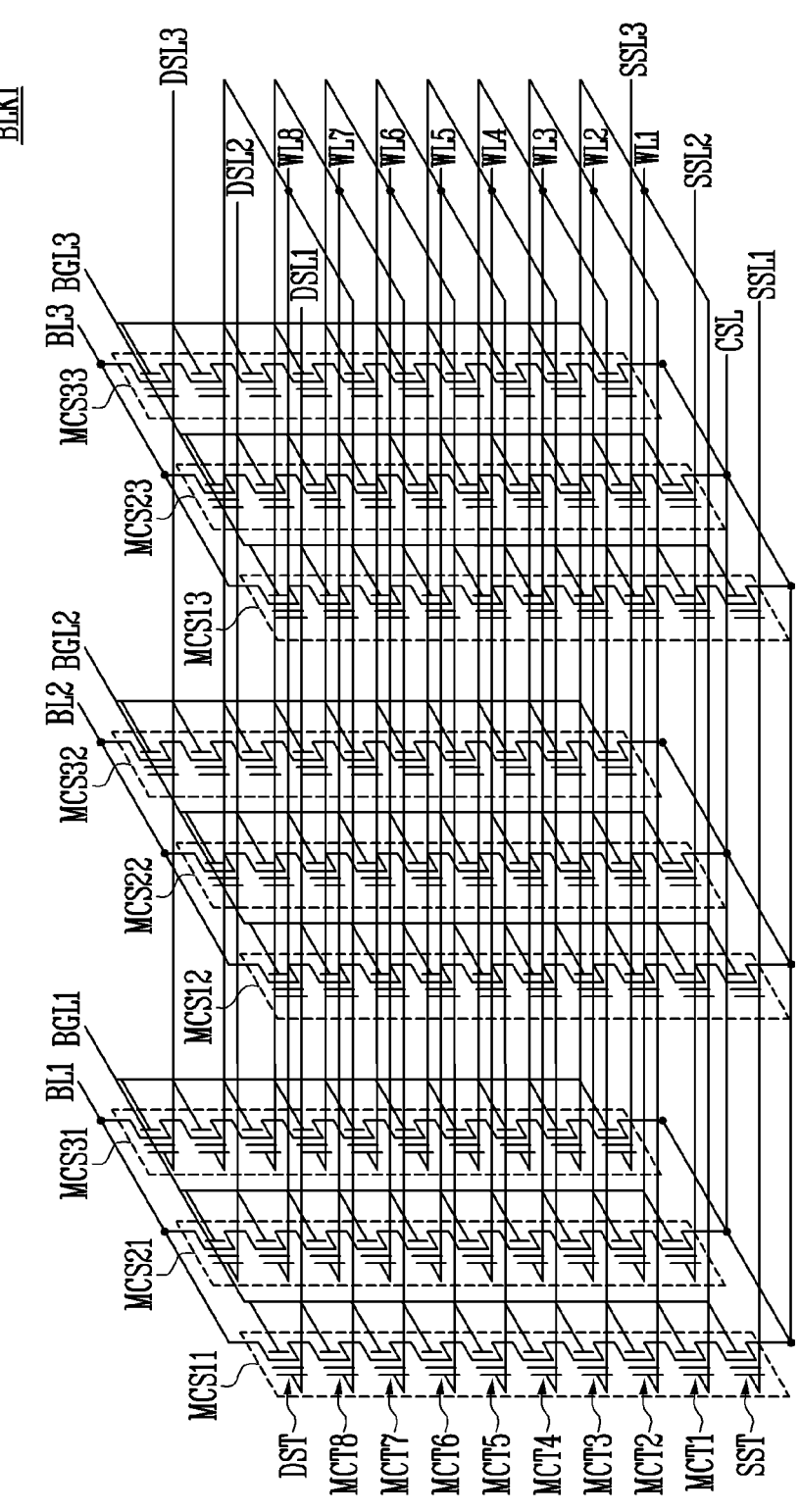
FIG. 2 is an equivalent circuit diagram illustrating a memory block of FIG. 1.

FIG. 2 is an equivalent circuit diagram illustrating the memory block of FIG. 1.

Referring to FIG. 2, the memory block BLK1 may include memory cell strings MCS11 to MCS33, word lines WL1 to WL8, drain select lines DSL1 to DSL3, source select lines SSL1 to SSL3, and a common source line CSL.

The memory cell strings MCS11, MCS21, and MCS31 may be provided between a first bit line BL1, a first backgate line BGL1, and the common source line CSL, the memory cell strings MCS12, MCS22, and MCS32 may be provided between a second bit line BL2, a second backgate line BGL2, and the common source line CSL, and the memory cell strings MCS13, MCS23, and MCS33 may be provided between a third bit line BL3, a third backgate line BGL3, and the common source line CSL. Each of the memory cell strings (e.g. MCS11) may include a drain select transistor DST, a plurality of memory cells MCT1 to MCT8, and a source select transistor SST, which are connected in series to each other.

The drain select transistor DST may be connected to a corresponding drain select line DSL1 to DSL3. The plurality of memory cells MCT1 to MCT8 may be connected to corresponding word lines WL1 to WL8, respectively. The source select transistor SST may be connected to a corresponding source select line SSL1 to SSL3. The drain select transistor DST may be connected to a corresponding bit line BL1 to BL3, while the source select transistor SST may be connected to the common source line CSL.

In this embodiment, the word lines (e.g. WL1) of the same height may be connected to each other in common, the drain select lines DSL1 to DSL3 may be separated from each other, and the source select lines SSL1 to SSL3 may be separated from each other.

The operation of the memory cell strings, illustrated in FIG. 2, will be described as follows.

In order to improve the boosting efficiency of non-selected memory cell strings, except for the memory cell string (e.g. MCS11) that are selected at a first step, the source select transistor SST and the common source line CSL may be floated.

At a second step, the remaining word lines WL2 to WL8 other than the word line WL1 corresponding to the memory cell (e.g. MCT1) to be programmed may be floated. In this case, a program voltage may be applied to the word line WL1 corresponding to the memory cell (e.g. MCT1) to be programmed.

At a third step, a program operation may be performed on a target memory cell MCT1 by applying the voltage for the program operation to the first backgate line BGL1 corresponding to the selected memory cell string MCS11. In detail, the target memory cell MCT1 may be selectively programmed by a program voltage that is applied to the word line WL1 corresponding to the memory cell (e.g. MCT1) to be programmed, a program enable voltage or a program inhibit voltage that is applied to the bit line BL1 of the selected memory cell string MCS11, and a pass voltage that is applied to the first backgate line BGL1.

In the above-described program operation, a disturb phenomenon, due to the pass voltage that is applied to the non-selected word lines, may be prevented, not by applying the pass voltage to the non-selected word lines, but by applying the pass voltage to the backgate line. Further, by preventing the disturb phenomenon, a program operation characteristic may be improved, so that cell characteristics and reliability may be improved, and a channel formation rate in a channel layer of the selected memory cell string may be improved.

Figure 3A:
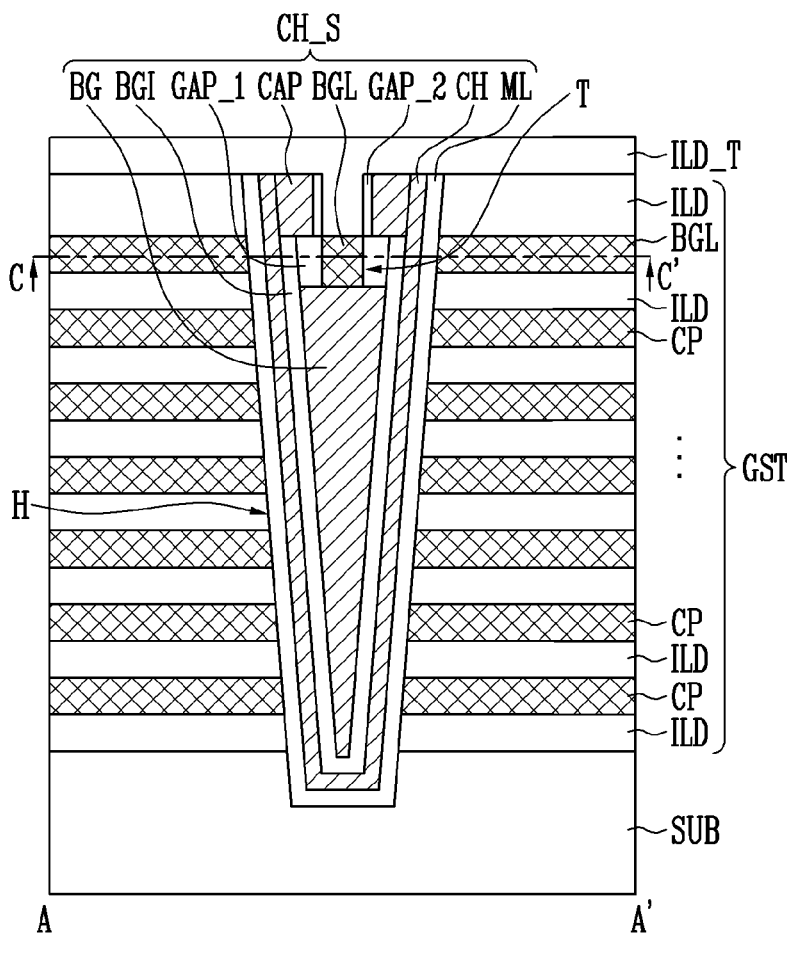
FIGS. 3A, 3B, and 3C are views illustrating the structure of a memory cell string.
Figure 3B:
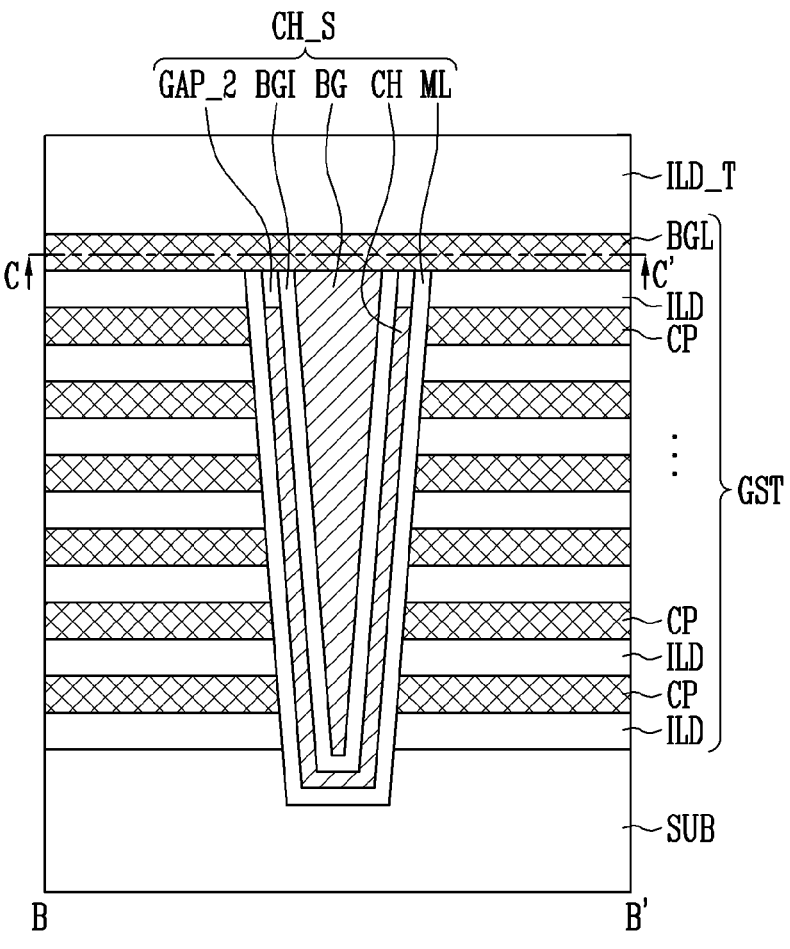
Figure 3C:
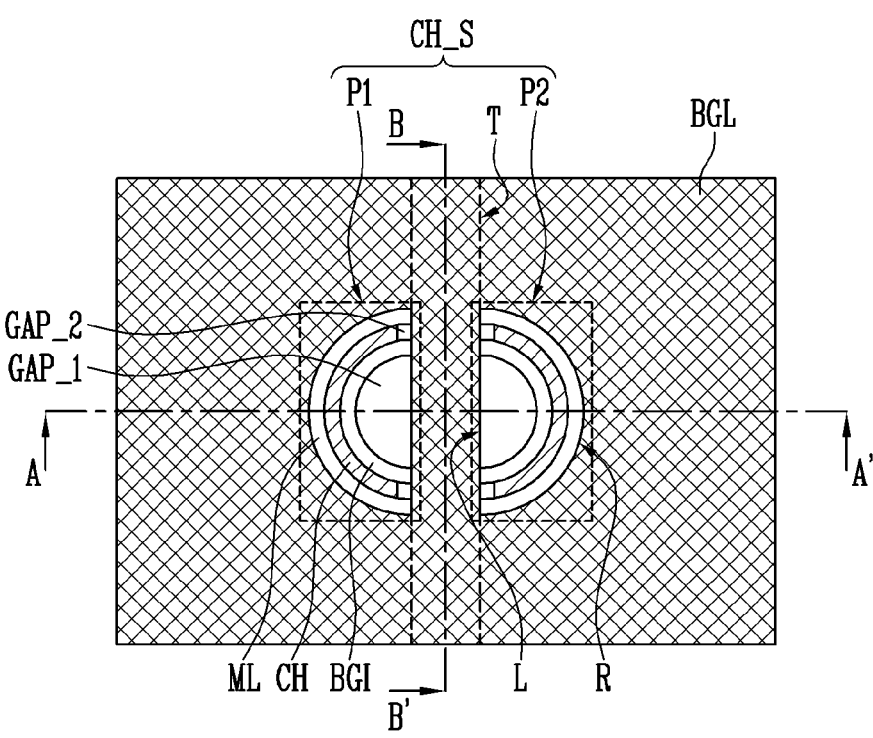

FIGS. 3A, 3B, and 3C are views illustrating the structure of the memory cell string.

FIG. 3A is a sectional view taken in an A-A' direction of a vertical channel structure corresponding to the memory cell string, and FIG. 3B is a sectional view taken in a B-B' direction of the vertical channel structure, in which the A-A' direction and the B-B' direction are perpendicular to each other in the vertical channel structure. FIG. 3C is a plan view of a layer C-C' on which a conductive layer BGL corresponding to a backgate line is disposed.

Referring to FIGS. 3A and 3B, the vertical channel structure CH_S may be disposed to pass vertically through a gate stacked body GST stacked on a semiconductor substrate SUB.

The gate stacked body GST may include a plurality of interlayer insulating layers ILD and a plurality of conductive layers CP and BGL that are alternately stacked on the semiconductor substrate SUB. The uppermost conductive layer, among the plurality of conductive layers, may be the conductive layer BGL corresponding to the backgate line, and the remaining conductive layers may be a conductive layer CP for the word line. In an embodiment of the present disclosure, the conductive layer BGL corresponding to the backgate line and the conductive layer CP for the word line may be formed through the same process and may be formed of the same material.

The vertical channel structure CH_S may extend in a vertical direction and may include a memory layer ML, a channel layer CH, a backgate insulating layer BGI, a backgate BG, a first gap insulating layer GAP_1, a capping conductive layer CAP, and a second gap insulating layer GAP_2.

The memory layer ML may be formed along a sidewall and a lower surface of a channel hole H which passes through the gate stacked body GST. The memory layer ML may include at least one of a tunneling layer, a data storage layer or a blocking layer. The data storage layer may include a floating gate, a charge trap material, polysilicon, nitride, a variable resistance material, or a nano structure, or may include a combination thereof. The memory layer ML may extend in a vertical direction and may be formed to enclose a sidewall and a lower surface of the channel layer CH.

The channel layer CH may be formed along an inner wall and a lower surface of the memory layer ML. The channel layer CH may be a region in which channels, such as memory cells and source and drain select transistors, are formed. The channel layer CH may include a semiconductor material, such as silicon or germanium. The channel layer CH may extend in the vertical direction and may be formed to enclose a sidewall and a lower surface of the backgate insulating layer BGI.

The backgate insulating layer BGI may be formed along the inner wall and the lower surface of the channel layer CH and may be formed such that a portion of an upper sidewall of the channel layer CH may be exposed. In other words, the backgate insulating layer BGI may extend along the inner wall of the channel layer CH and may be formed to be lower in height than an upper portion of the channel layer CH. For instance, the backgate insulating layer BGI may extend in the vertical direction as high as an upper portion of the conductive layer BGL corresponding to the backgate line. The backgate insulating layer BGI may extend in the vertical direction and may be formed to enclose a sidewall and a lower surface of the backgate BG.

The backgate BG may be disposed to extend in the vertical direction in the central region of the channel hole H and may contact the inner wall and the lower surface of the backgate insulating layer BGI. The top of the backgate BG may be lower in height than the lower surface of the conductive layer BGL corresponding to the backgate line. The backgate BG may be formed of a semiconductor material, such as silicon or germanium or a conductive metal material.

A first gap insulating layer GAP_1 may be formed to contact the inner wall of the backgate insulating layer BGI and the upper surface of the backgate BG and may separate the capping conductive layer CAP from the backgate BG. The first gap insulating layer GAP_1 may be formed of an insulating material, such as an oxide layer. Further, the first gap insulating layer GAP_1 may be separated into two ends by the conductive layer BGL corresponding to the backgate line extending in the B-B' direction. For instance, the first gap insulating layer GAP_1 may be separated into two ends by a line-shaped trench T extending in the B-B' direction, and the conductive layer BGL corresponding to the backgate line may be disposed on a lower surface of the trench T.

The capping conductive layer CAP may be formed to contact the inner wall of the channel layer CH and the upper surfaces of the backgate insulating layer BGI and the first gap insulating layer GAP_1. The capping conductive layer CAP may be formed of a conductive material, such as polysilicon.

A second gap insulating layer GAP_2 may be disposed between the upper surface of the channel layer CH and the conductive layer BGL corresponding to the backgate line to electrically and physically separate the channel layer CH from the conductive layer BGL corresponding to the backgate line. The second gap insulating layer GAP_2 may be formed of an insulating material, such as an oxide layer or a nitride layer.

An upper insulating layer ILD_T may be formed on the gate stacked body GST and the vertical channel structure CH_S.

Referring to FIG. 3C, the circular vertical channel structure CH_S may be separated into two ends by the line-shaped trench T in the layer on which the conductive layer BGL corresponding to the backgate line is disposed. Thus, the upper end of the vertical channel structure CH_S may be divided into a first portion P1 and a second portion P2, each having a semicircular shape in the layer on which the conductive layer BGL corresponding to the backgate line is disposed. The first portion P1 and the second portion P2 may be defined as one pair.

The conductive layer BGL corresponding to the backgate line may be formed to enclose an elliptical sidewall R and a linear sidewall L of each of the first portion P1 and the second portion P2. In this case, the second gap insulating layer GAP_2 may be disposed between the channel layer CH and the conductive layer BGL corresponding to the backgate line, so that the channel layer CH and the conductive layer BGL corresponding to the backgate line might not be electrically connected.

According to the above-described embodiment of the present disclosure, the lower end of the vertical channel structure CH_S passing through the interlayer insulating layers ILD and the conductive layers CP for the word lines may have a circular structure or a structure with a polygonal shape in a plan view, while the upper end of the vertical channel structure CH_S passing through the conductive layer BGL corresponding to the backgate line may have a pair of semicircular structures facing each other in a plan view.

According to the above-described embodiment of the present disclosure, the lower end of the vertical channel structure may include the backgate BG extending in the vertical direction, the backgate insulating layer BGI enclosing the sidewall of the backgate BG, the channel layer CH enclosing the sidewall of the backgate insulating layer BGI, and the memory layer ML enclosing the sidewall of the channel layer CH. Further, the upper end of the vertical channel structure may include the first portion P1 and the second portion P2, each having the semicircular cross-section, and each of the first portion P1 and the second portion P2 may have a curved sidewall R and a linear sidewall L. Further, the first gap insulating layer GAP_1 of each of the first portion P1 and the second portion P2 may have a curved sidewall and a linear sidewall, the backgate insulating layer BGI may enclose the curved sidewall of the first gap insulating layer GAP_1, the channel layer CH may enclose the curved sidewall of the backgate insulating layer BGI, and the memory layer ML may be disposed to enclose the curved sidewall of the channel layer CH. In this case, the second gap insulating layer GAP_2 may be disposed between two ends of the channel layer CH and the conductive layer BGL corresponding to the backgate line, thereby preventing the channel layer CH and the conductive layer BGL corresponding to the backgate line from being electrically connected.

According to the above-described embodiment of the present disclosure, the conductive layer BGL corresponding to the backgate line connected to the backgate BG may be formed to directly contact the upper surface of the backgate BG, and may be disposed to be parallel to the conductive layers CP for the word lines. The sidewall of the upper end of the vertical channel structure CH_S that is separated into two ends by the trench T may be entirely enclosed by the conductive layer BGL corresponding to the backgate line.

FIGS. 4, 5, 6A, 6B, 6C, 7A, 7B, 7C, 8A and 8B may be views illustrating a method of manufacturing a semiconductor memory device according to an embodiment of the present disclosure.

Figure 4:
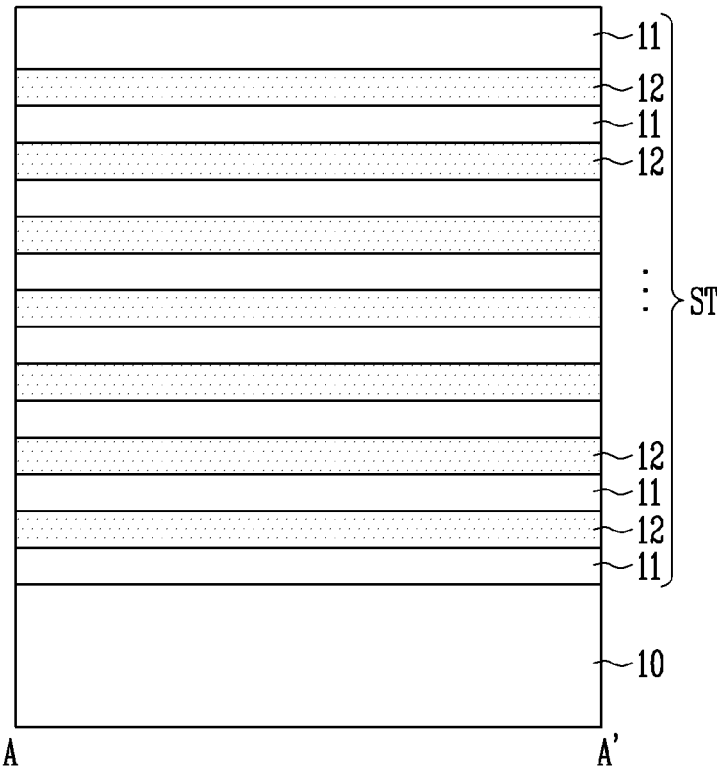
FIGS. 4, 5, 6A, 6B, 6C, 7A, 7B, 7C, 8A and 8B are views illustrating a method of manufacturing a semiconductor memory device according to an embodiment of the present disclosure.

Referring to FIG. 4, a stack ST may be formed on a base 10. The base 10 may be a semiconductor substrate, a source structure, or the like. The semiconductor substrate may include a source region that is doped with impurities. The source structure may include a source layer including a conductive material, such as polysilicon, tungsten, molybdenum, or metal. Alternatively, the source structure may include a sacrificial layer to be replaced with the source layer in a subsequent process.

The stack ST may be formed by alternately forming first material layers 11 and second material layers 12. The first material layers 11 may include material having a high etch selectivity with respect to the second material layers 12. In an embodiment, the first material layers 11 may include an insulating material, such as oxide, and the second material layers 12 may include a sacrificial material, such as nitride. The first material layers 11 may be defined as interlayer insulating layers, and the second material layers 12 may be defined as sacrificial layers. The second material layers 12 may be replaced with the conductive layer corresponding to the backgate line and the conductive layers corresponding to the plurality of word lines in a subsequent replacement process.

Figure 5:
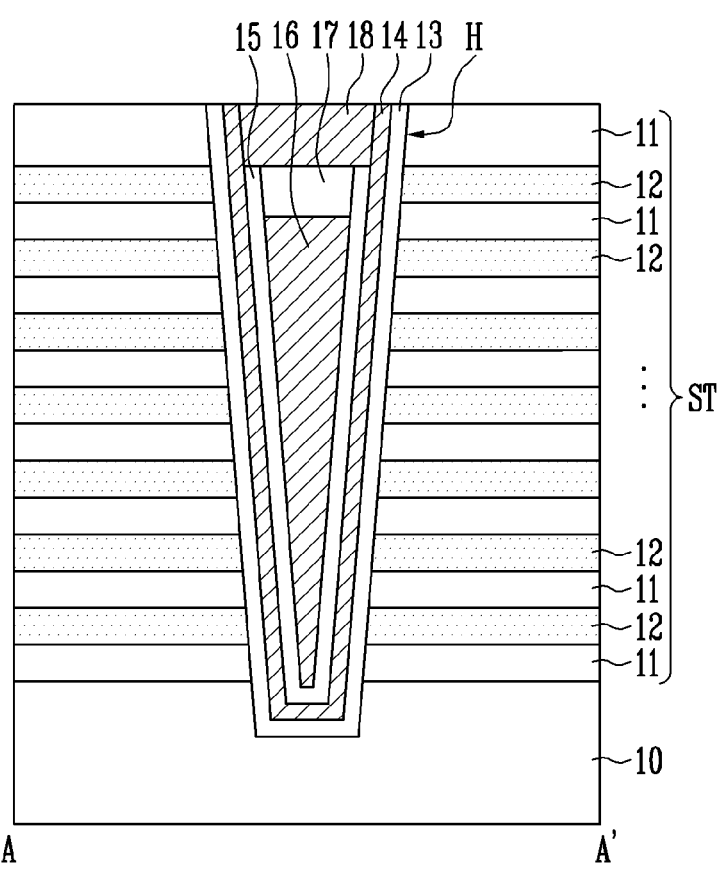

Referring to FIG. 5, channel structures 13, 14, 15, 16, 17, and 18 passing through the stack ST may be formed. The channel structures 13, 14, 15, 16, 17, and 18 may have a circular shape, an elliptical shape, or a polygonal shape in a plan view.

In an embodiment, after forming the channel hole H passing through the stack ST, the memory layer 13, the channel layer 14, and the backgate insulating layer 15 may be sequentially and conformally formed along the surface of the channel hole H.

The memory layer 13 may include a tunnel insulating layer, a data storage layer, and a blocking insulating layer. The channel layer 14 may include a semiconductor material, such as silicon or germanium. The backgate insulating layer 15 may be formed of an insulating material, such as a silicon oxide layer or a nitride layer.

Thereafter, the backgate 16 may be formed by filling the open central region of the channel hole H with a conductive material. The backgate 16 may perform an etch-back process so that the position of an upper surface thereof may be lower than that of the second material layer 12 that is located at the uppermost position. The backgate 16 may be formed of a metal layer. For instance, the backgate 16 may be formed of a metal material, such as tungsten, tungsten silicide, or ruthenium.

Thereafter, the first gap insulating layer 17 may be formed by filling an area in which the backgate 16 is recessed with an insulating material. The first gap insulating layer 17 may be formed of an oxide layer.

Thereafter, the first gap insulating layer 17 and the backgate insulating layer 15 may be etched to a certain depth to form a recessed area, and then the capping layer 18 may be formed by filling the recessed area with the conductive material. The capping layer 18 may include an n-type doped silicon layer.

Figure 6A:
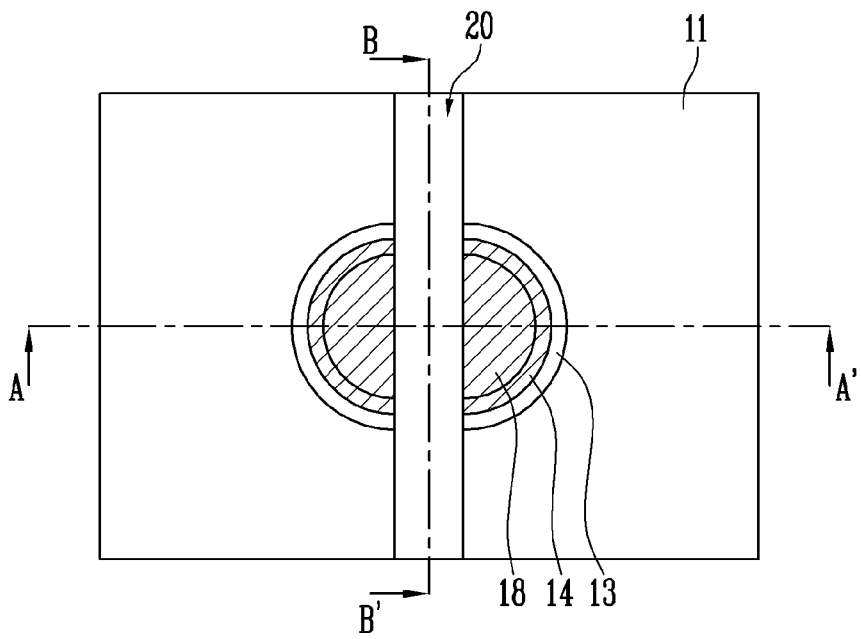
Figure 6B:
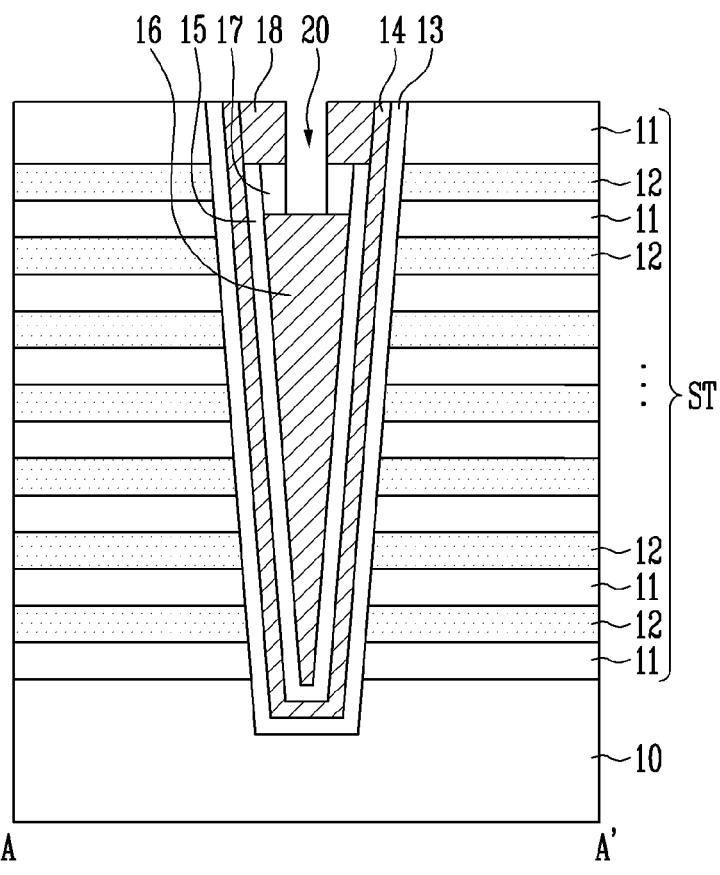
Figure 6C:
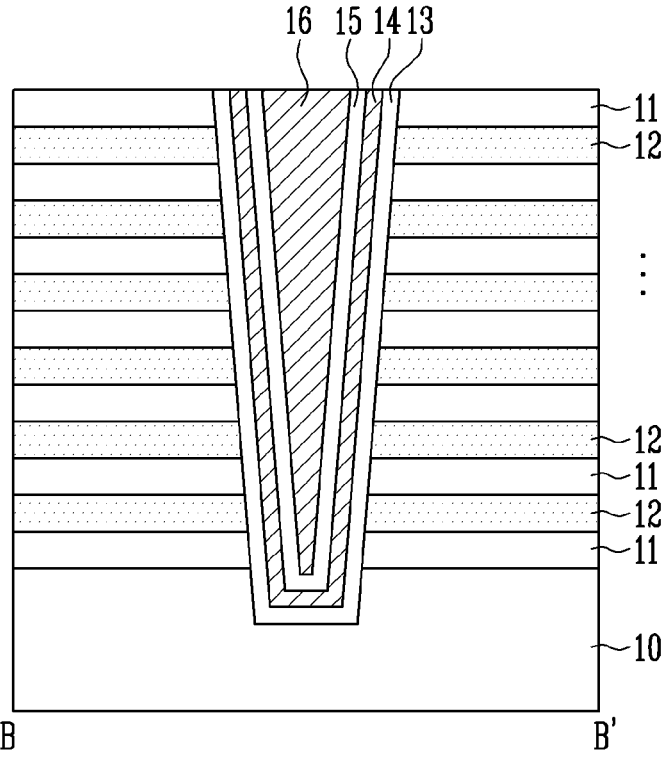

Referring to FIGS. 6A, 6B and 6C, a line-shaped trench 20 overlapping the channel structure may be formed. The trench 20 may be formed by etching the capping layer 18, the first gap insulating layer 17, the memory layer 13, the channel layer 14, the backgate insulating layer 15, the uppermost first material layer 11, and the uppermost second material layer 12. The capping layer 18 and the first gap insulating layer 17 may both be separated into two ends by the trench 20. In addition, the upper end of the channel structure may be divided by the trench 20 to have the shape of semicircles facing each other. The upper end of the channel structure may be defined as a portion that is higher than the backgate 16 in the channel structure.

Before the process of forming the trench 20, an additional interlayer insulating layer may be formed on the entire structure to prevent the upper portion of the vertical channel layer from being exposed.

Figure 7A:
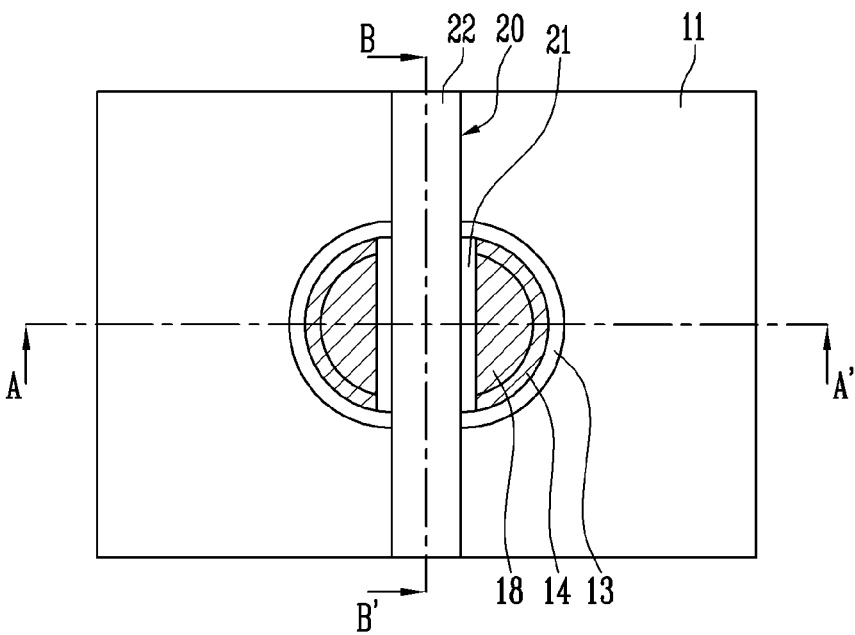
Figure 7B:
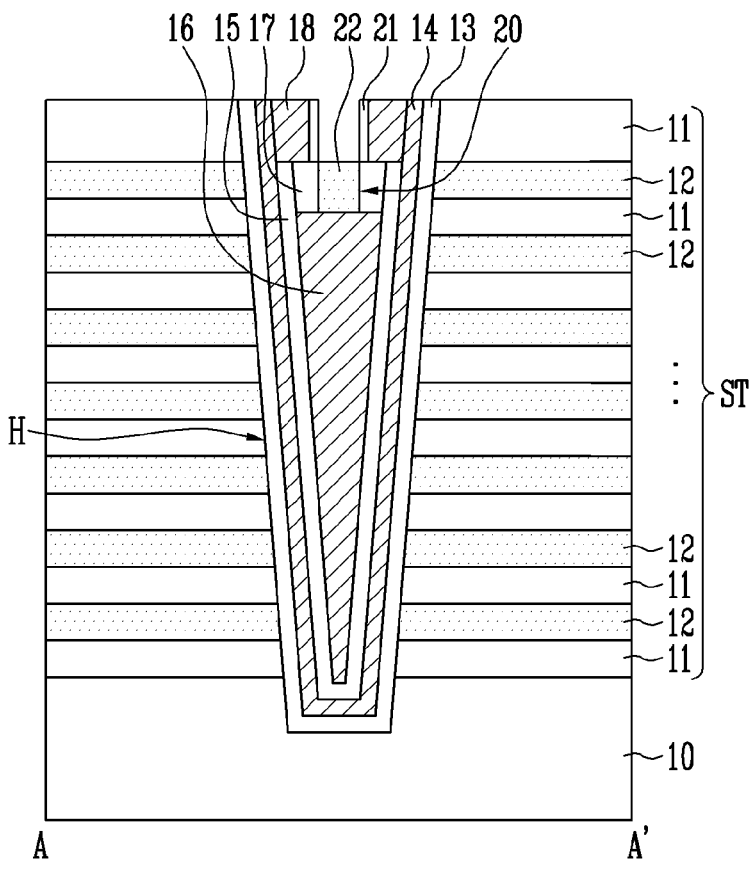
Figure 7C:
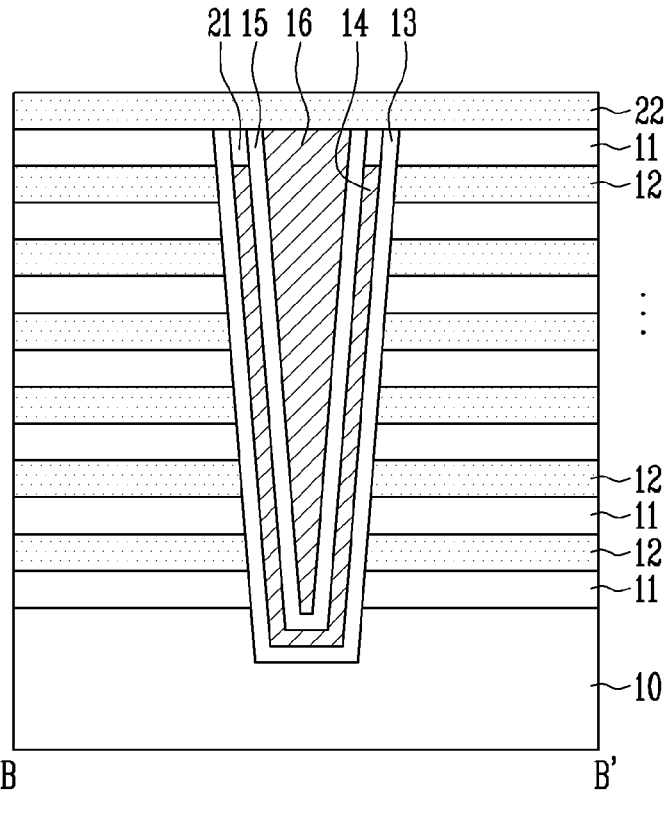

Referring to FIGS. 7A, 7B and 7C, a second gap insulating layer 21 may be formed on the sidewall of the capping layer 18, the sidewall and the upper surface of the channel layer 14, which may be exposed by the trench 20. The second gap insulating layer 21 may be formed of an oxide layer. The second gap insulating layer 21 may be formed through an oxidation process.

Subsequently, a third material layer 22 may be formed on the lower surface of the trench 20. The third material layer 22 may be preferably formed of the same material as the second material layer. The third material layer 22 may be preferably formed to have the same height as the uppermost second material layer 12. In other words, the height of the upper surface of the third material layer 22 may be preferably the same as that of the uppermost second material layer 12. The third material layer 22 may preferably contact the second material layer 12 in a region outside of the channel structure.

Figure 8A:
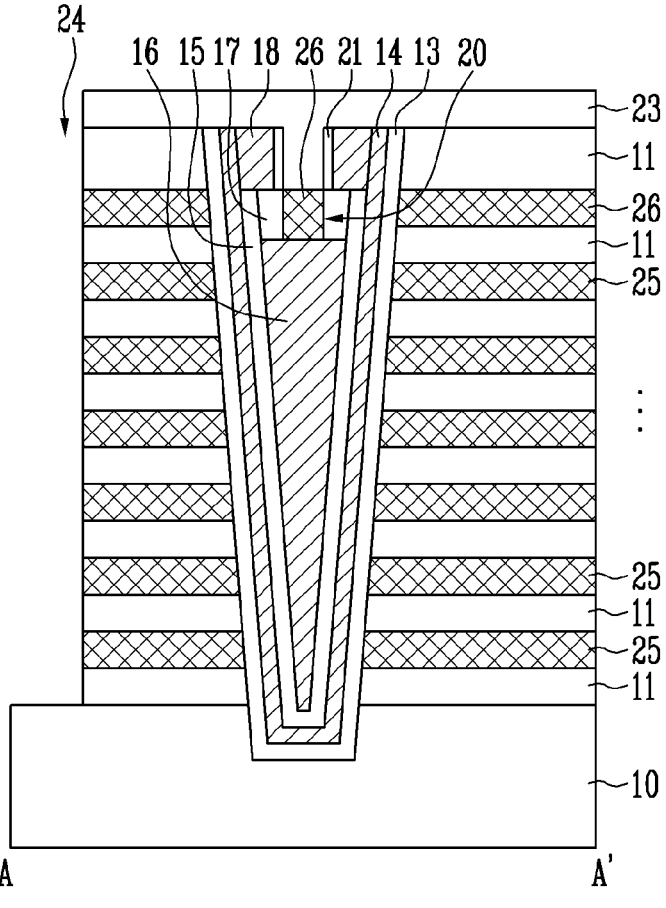
Figure 8B:
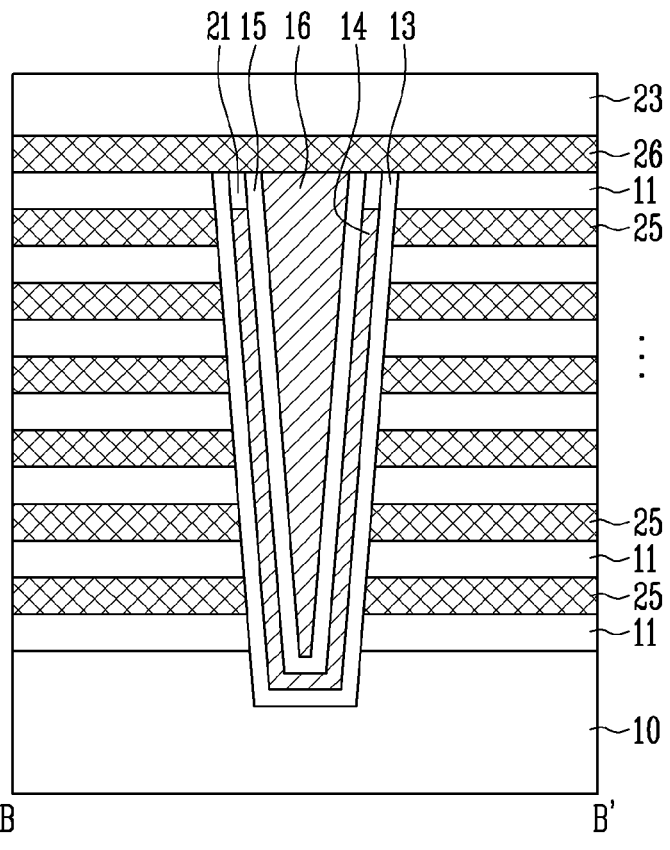

Referring to FIGS. 8A and 8B, an upper insulating layer 23 may be formed on the entire structure. The upper insulating layer 23 may be formed to fill the trench 20. The upper insulating layer 23 may be formed of an oxide layer.

Thereafter, a slit 24 may be formed by etching the upper insulating layer 23, the plurality of first material layers 11, and the plurality of second material layers 12 (see FIG. 7B).

Subsequently, a replacement process may be performed in which the plurality of second material layers 12 (see FIG.

7B) is replaced with the conductive layers 25 for the word lines and the conductive layer 26 for the backgate line.

For instance, the recessed area may be formed by removing the plurality of second material layers 12 (see FIG. 7B) that are exposed through the slit 24. At this time, the third material layer 22 (FIG. 7B) that contacts the uppermost second material layer may be also removed. Thereafter, the conductive layers 25 for the word lines and the conductive layers 26 for the backgate lines may be formed together by filling the recessed area from which the second material layer and the third material layer are removed with a conductive material. The conductive layer 26 for the backgate line may be directly connected to the upper surface of the backgate 16.

FIGS. 9, 10, 11, 12A, 12B, 12C, 13A, 13B, 14A, 14B, 15A and 15B are views illustrating a method of manufacturing a semiconductor memory device according to an embodiment of the present disclosure.

Figure 9:
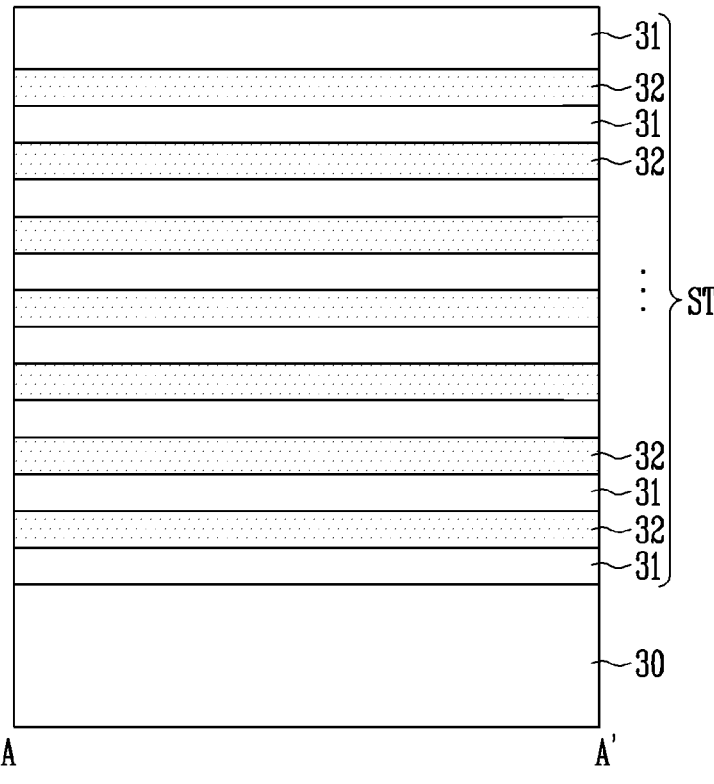
FIGS. 9, 10, 11, 12A, 12B, 12C, 13A, 13B, 14A, 14B, 15A and 15B are views illustrating a method of manufacturing a semiconductor memory device according to an embodiment of the present disclosure.

Referring to FIG. 9, a stack ST may be formed on a base 30. The base 30 may be a semiconductor substrate, a source structure, or the like. The semiconductor substrate may include a source region that is doped with impurities. The source structure may include a source layer including a conductive material, such as polysilicon, tungsten, molybdenum, or metal. Alternatively, the source structure may include a sacrificial layer to be replaced with the source layer in a subsequent process.

The stack ST may be formed by alternately forming first material layers 31 and second material layers 32. The first material layers 31 may include material having a high etch selectivity with respect to the second material layers 32. In an embodiment, the first material layers 31 may include an insulating material, such as oxide, and the second material layers 32 may include a sacrificial material, such as nitride.

Figure 10:
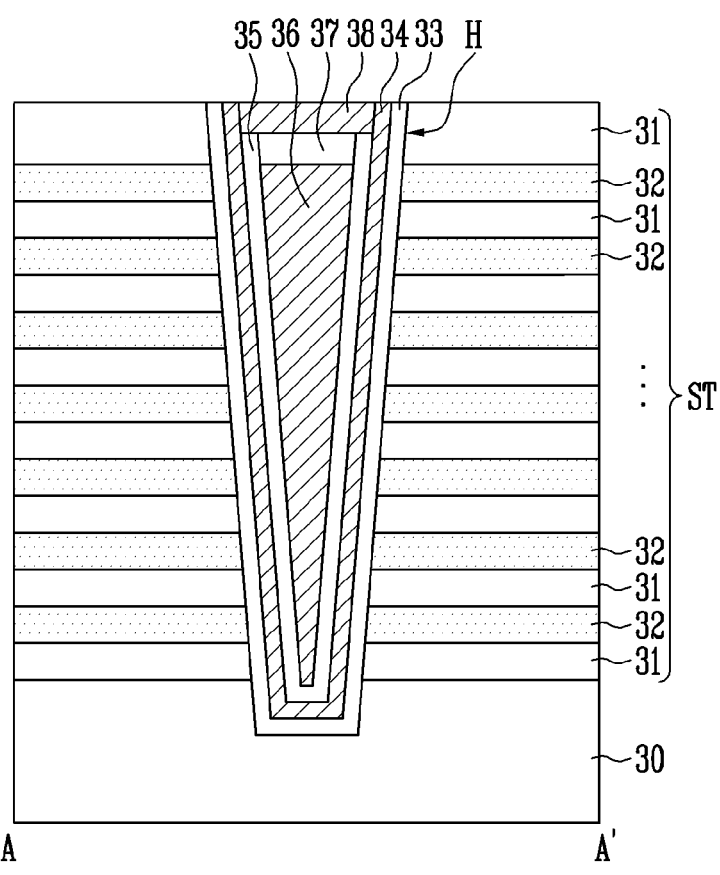

Referring to FIG. 10, channel structures 33, 34, 35, 36, 37, and 38 passing through the stack ST may be formed. The channel structures 33, 34, 35, 36, 37, and 38 may have a circular shape, an elliptical shape, or a polygonal shape in a plan view.

In an embodiment, after forming the channel hole H passing through the stack ST, the memory layer 33, the channel layer 34, and the backgate insulating layer 35 may be sequentially formed conformally along the surface of the channel hole H.

The memory layer 33 may include a tunnel insulating layer, a data storage layer, and a blocking insulating layer. The channel layer 34 may include a semiconductor material, such as silicon or germanium. The backgate insulating layer 35 may be formed of an insulating material, such as a silicon oxide layer or a nitride layer.

Thereafter, the backgate 36 may be formed by filling the open central region of the channel hole H with a conductive material. The backgate 36 may perform an etch-back process so that the position of an upper surface thereof may be equal to or higher than that of the second material layer 32 that is located at the uppermost position. The backgate 36 may be formed of a metal layer. For instance, the backgate 36 may be formed of a metal material, such as tungsten, tungsten silicide, or ruthenium.

Thereafter, the first gap insulating layer 37 may be formed by filling an area in which the backgate 36 is recessed with an insulating material. The first gap insulating layer 37 may be formed of an oxide layer.

Thereafter, the first gap insulating layer 37 and the backgate insulating layer 35 may be etched to a certain depth to form a recessed area, and then the capping layer 38 may be formed by filling the recessed area with the conductive material. The capping layer 38 may include an n-type doped silicon layer.

Figure 11:
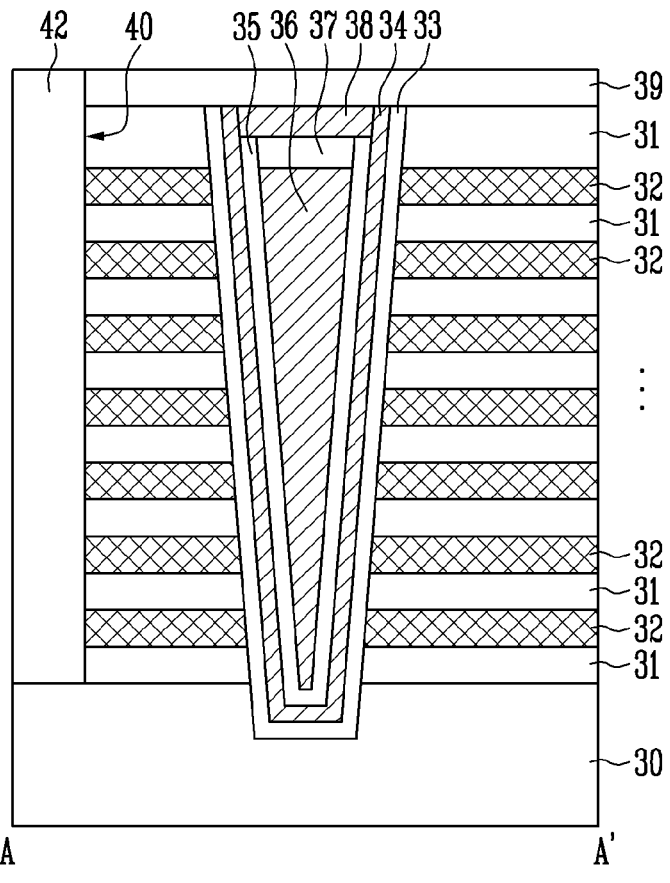

Referring to FIG. 11, an upper insulating layer 39 may be formed on the entire structure including the first material layer 31 at the uppermost location and the channel structures 33, 34, 35, 36, 37, and 38. The upper insulating layer 39 may be formed of an oxide layer.

Thereafter, a slit 40 may be formed by etching the upper insulating layer 39, the plurality of first material layers 31, and the plurality of second material layers 32 (see FIG. 10).

Subsequently, a replacement process may be performed. For instance, a recessed area may be formed by removing the plurality of second material layers 32 (see FIG. 10) exposed through the slit 40. Thereafter, gate conductive layers 32 may be formed by filling the recessed area from which the second material layer has been removed with the conductive material. The gate conductive layer that is disposed on the gate conductive layers 32 may be used as a backgate line, while the remaining gate conductive layers may be used as word lines and select lines. Thereafter, the slit 40 may be filled with an insulating layer 42.

Figure 12A:
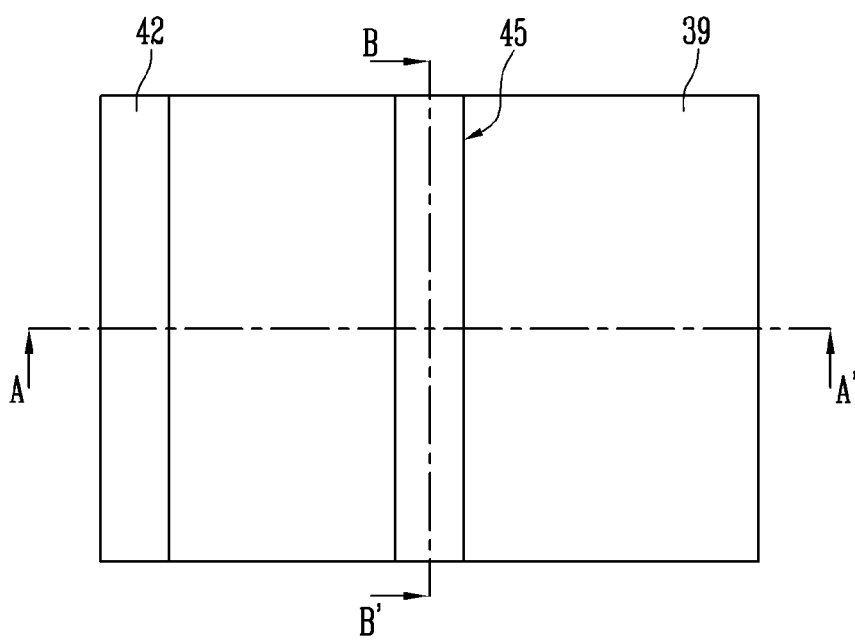
Figure 12B:
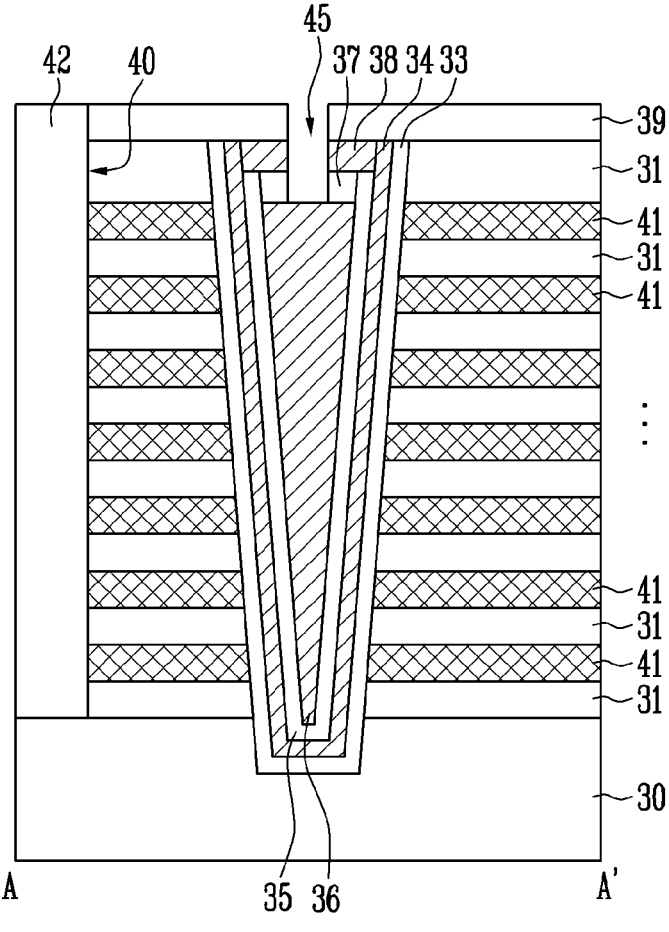
Figure 12C:
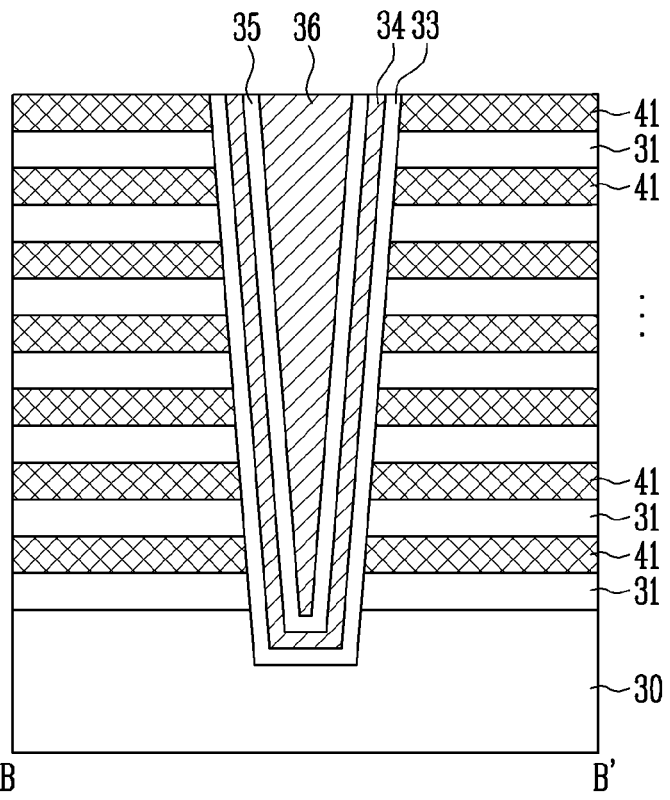

Referring to FIGS. 12A, 12B and 12C, a line-shaped trench 45 overlapping the channel structure may be formed. The trench 45 may be formed by etching the upper insulating layer 39, the capping layer 38, the first gap insulating layer 37, the memory layer 33, the channel layer 34, the backgate insulating layer 35, and the uppermost first material layer 31. The upper surface of the uppermost gate conductive layer 41 may be exposed by the trench 45. The capping layer 38 and the first gap insulating layer 37 may be separated into two ends by the trench 45. In addition, the upper end of the channel structure may have the shape of semicircles facing each other by the trench 45. The upper end of the channel structure may be defined as a portion that is higher than the backgate 36 in the channel structure.

An additional insulating layer may be formed on the upper insulating layer 39 before the process of forming the trench 45. The additional insulating layer may be formed of a nitride layer or an oxide layer or a nitride layer and an oxide layer.

Figure 13A:
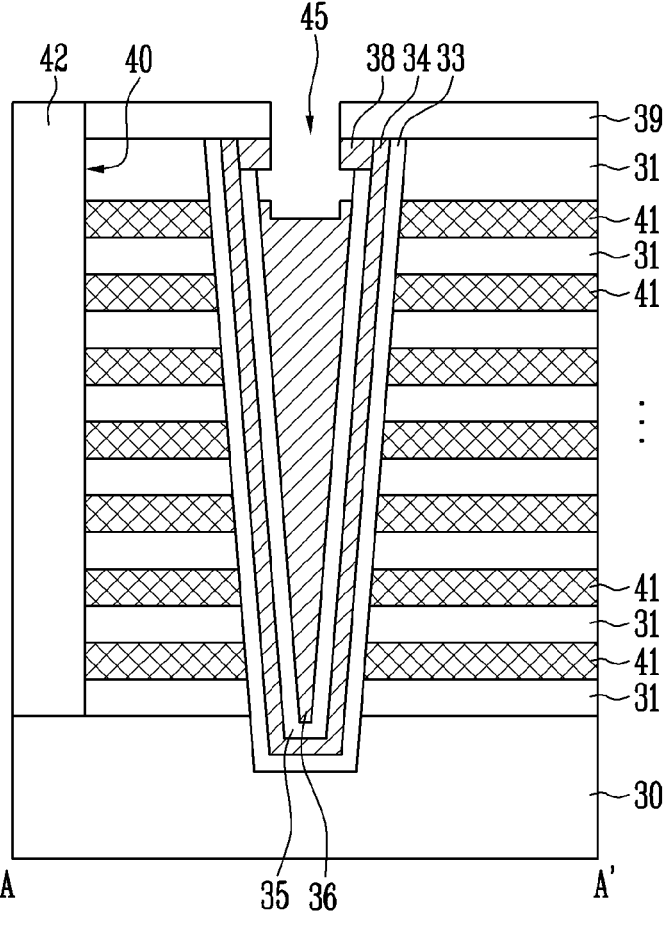
Figure 13B:
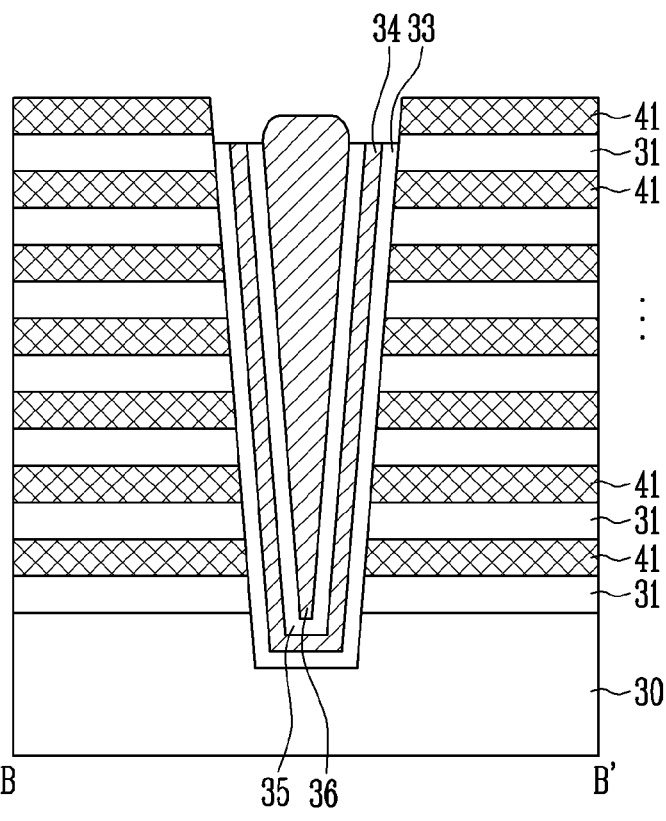

Referring to FIGS. 13A and 13B, a first etching process may be performed to remove the first gap insulating layer 37 (see FIG. 12B). Thereafter, a second etching process may be performed to remove the channel layer 34 that is exposed through the trench 45. During the second etching process, a sidewall of the capping layer 38 and a portion of the upper surface of the backgate 36 may be etched. Thereafter, a third etching process may be performed to remove the memory layer 33 that is exposed through the trench 45. After a nitride layer is formed on the lower surface of the trench 45 for the removal process of the memory layer 33, both the nitride layer and the memory layer 33 may be removed through the etching process.

By forming the trench 45 through the first to third etching processes described above, the upper surface of the backgate 36 may be exposed from the lower surface of the trench 45, and the uppermost gate conductive layer 41 may be separated into two ends by the trench 45.

Figure 14A:
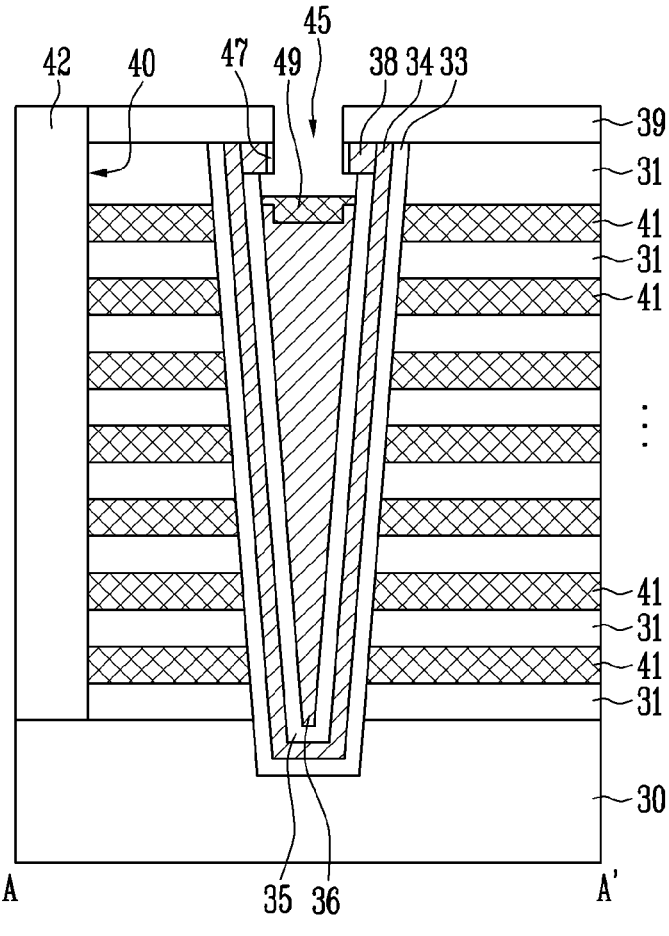
Figure 14B:
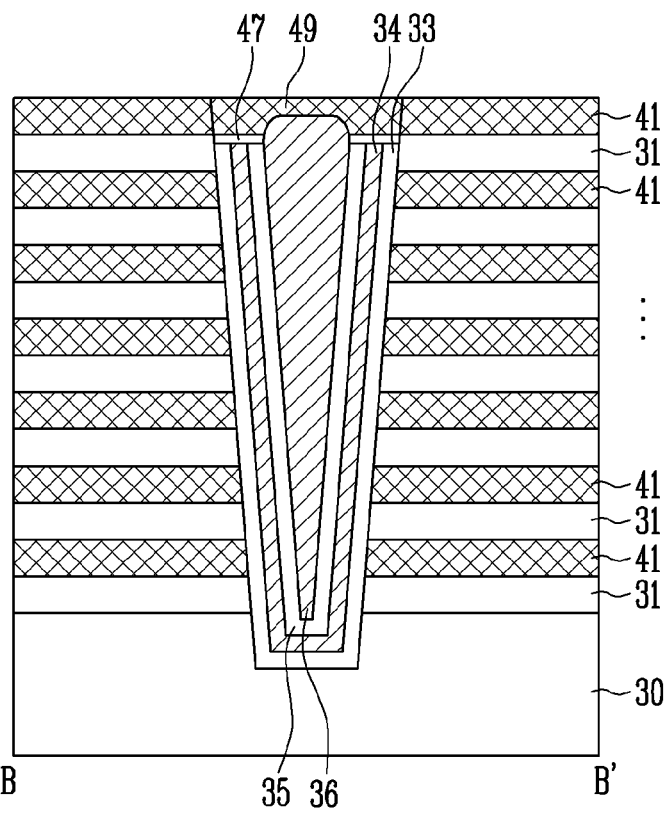

Referring to FIGS. 14A and 14B, a second gap insulating layer 47 may be formed to cover the upper surface of the channel layer 34 and the sidewall surface of the capping layer 38, which may be exposed through the trench 45. The second gap insulating layer 47 may be formed of an insulating material, such as an oxide layer or a nitride layer.

Figure 15A:
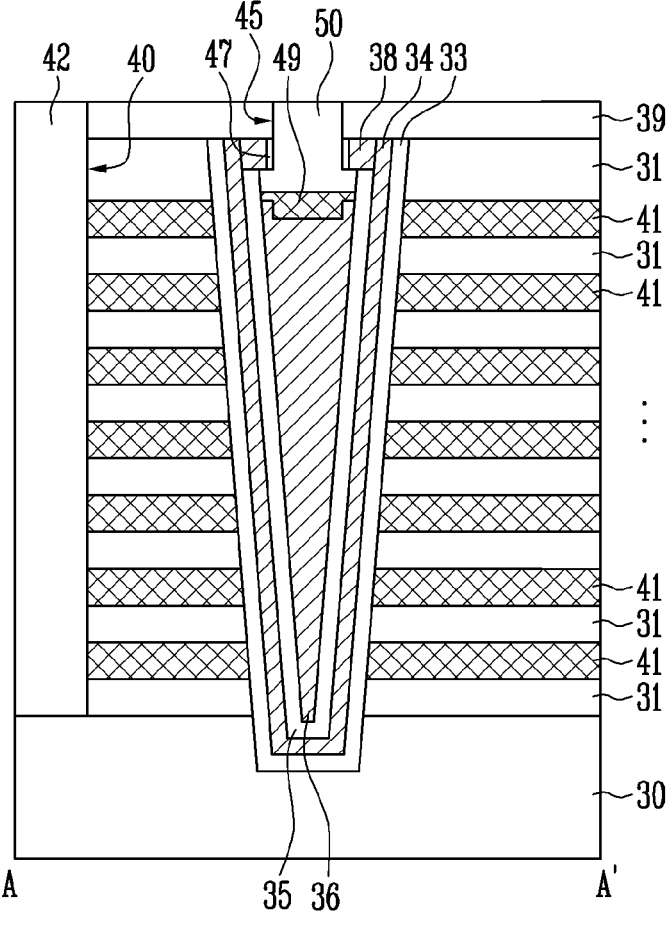
Figure 15B:
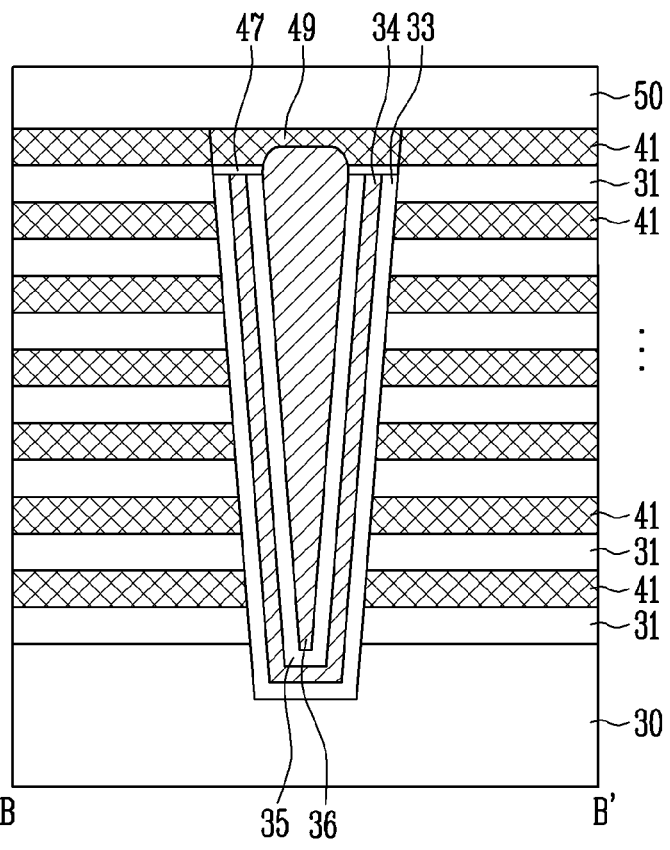

Referring to FIGS. 15A and 15B, a connection line 49 may be formed by filling the lower surface of the trench 45 with a conductive material. The connection line 49 may electrically connect the two ends of the uppermost gate conductive layer 41 that are separated by the trench 45 and the backgate 36. The connection line 49 may be formed of a metal material, such as tungsten, tungsten silicide, or ruthenium, or may be formed of polysilicon doped with impurities.

Thereafter, an opening of the trench 45 may be filled with an insulating material 50.

Figure 16:
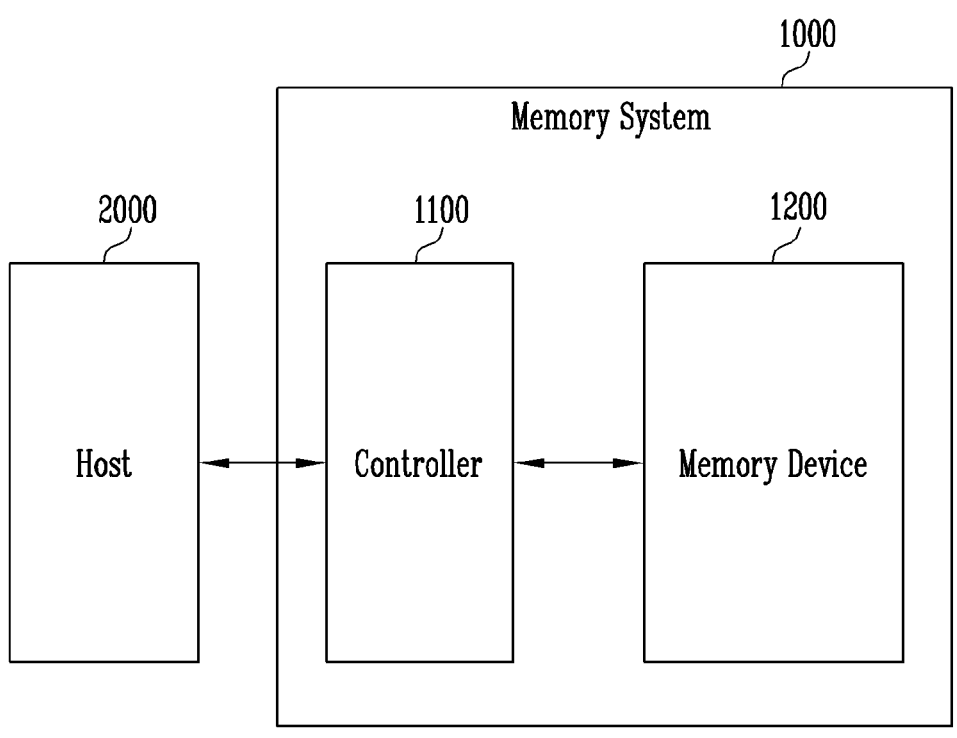
FIG. 16 is a diagram illustrating a memory system according to an embodiment of the present disclosure.

FIG. 16 is a diagram illustrating a memory system according to an embodiment of the present disclosure.

Referring to FIG. 16, the memory system 1000 may include a memory device 1200, which stores data, and a controller 1100 which performs communication between the memory device 1200 and a host 2000.

The host 2000 may be a device or system that stores data in the memory system 1000 or retrieves the data from the memory system 1000. The host 2000 may generate requests for various operations and output the generated requests to the memory system 1000. The requests may include a program request for a program operation, a read request for a read operation, and an erase request for an erase operation. The host 2000 may communicate with the memory system 1000 through various interfaces, such as a peripheral component interconnect express (PCIe) interface, an advanced technology attachment (ATA) interface, a serial ATA (SATA) interface, a parallel ATA (PATA) interface, a serial attached SCSI (SAS) interface, a non-volatile memory express (NVMe) interface, a universal serial bus (USB) interface, a multi-media card (MMC) interface, an enhanced small disk interface (ESDI), or an integrated drive electronics (IDE) interface.

The host 2000 may include at least one of a computer, a portable digital device, a tablet PC, a digital camera, a digital audio player, a television, a wireless communication device, and a cellular phone, but embodiments of the present disclosure may be not limited thereto.

The controller 1100 may control overall operation of the memory system 1000. The controller 1100 may control the memory device 1200 in response to the request from the host 2000. The controller 1100 may control the memory device 1200 to perform a program operation, a read operation, an erase operation, and the like in response to the request from the host 2000. Alternatively, the controller 1100 may perform a background operation for improving the performance of the memory system 1000 even if there may be no request from the host 2000.

The controller 1100 may transmit a control signal and a data signal to the memory device 1200 to control the operation of the memory device 1200. The control signal and the data signal may be transmitted to the memory device 1200 through different input/output lines. The data signal may include a command, an address, or data. The control signal may be used to identify a section in which the data signal is input.

The memory device 1200 may perform the program operation, the read operation, and the erase operation under the control of the controller 1100. The memory device 1200 may be formed of a volatile memory device in which data that are stored therein is lost when power supply is interrupted, or a non-volatile memory device in which data that are stored therein is maintained even when power supply is interrupted. The memory device 1200 may be a semiconductor memory device having the structure described above with reference to FIGS. 1, 2, 3A, 3B, and 3C. The memory device 1200 may be a semiconductor memory device manufactured by the manufacturing method described above with reference to FIGS. 4, 5, 6A, 6B, 6C, 7A, 7B, 7C, 8A, and 8B or the manufacturing method described above with reference to FIGS. 9, 10, 11, 12A, 12B, 12C, 13A, 13B, 14A, 14B, 15A, and 15B.

According to the present disclosure, a semiconductor memory device which is high in vertical height and is improved in electrical characteristics can be formed. Further, a backgate line connected to a backgate disposed in a central region of a vertical channel structure can be stably formed.

What is claimed is:

1. A semiconductor memory device comprising:
a gate stacked body comprising a plurality of interlayer insulating layers and a plurality of conductive layers that are alternately stacked, wherein a top-most conductive layer, among the plurality of conductive layers, corresponds to a backgate line and the rest of the plurality of conductive layers correspond to word lines; and
a vertical channel structure passing through the gate stacked body,
wherein a first part of the vertical channel structure passing through the plurality of interlayer insulating layers and the plurality of conductive layers corresponding to word lines has a circular structure in a plan view, and a second part of the vertical channel structure passing through the conductive layer corresponding to the backgate line has a pair of semicircular structures that are separated from each other in a plan view;
wherein, a portion of the conductive layer corresponding to the backgate line is disposed between the pair of semicircular structures of the second part of the vertical channel structure.

2. The semiconductor memory device according to claim 1, wherein the first part of the vertical channel structure comprises:
a vertically extending backgate;
a backgate insulating layer enclosing a sidewall of the backgate;
a channel layer enclosing a sidewall of the backgate insulating layer; and
a memory layer enclosing a sidewall of the channel layer.

3. The semiconductor memory device according to claim 2, wherein:
the second part of the vertical channel structure comprises a first portion and a second portion, each having a semicircular cross-section, and
each of the first and second portions comprises:
a first gap insulating layer having a curved sidewall and a linear sidewall;
the backgate insulating layer enclosing the curved sidewall of the first gap insulating layer;
the channel layer enclosing a curved sidewall of the backgate insulating layer;
the memory layer enclosing a curved sidewall of the channel layer; and
a second gap insulating layer disposed between two ends of the channel layer and the conductive layer corresponding to the backgate line.

4. The semiconductor memory device according to claim 3, wherein the conductive layer corresponding to the backgate line is directly connected to an upper surface of the backgate between the first portion and the second portion.

5. The semiconductor memory device according to claim 3, further comprising:
a capping layer disposed on top of the first and second portions.

6. The semiconductor memory device according to claim 5, wherein the first gap insulating layer is disposed between the capping layer and the backgate.

7. The semiconductor memory device according to claim 3, wherein the conductive layer corresponding to the backgate line is disposed between the first gap insulating layer of the first portion and the first gap insulating layer of the second portion.

8. The semiconductor memory device according to claim 3, wherein the second part of the vertical channel structure is separated into the first portion and the second portion by a line-shaped trench.

9. The semiconductor memory device according to claim 8, wherein a lower surface of the line-shaped trench contacts an upper surface of the backgate.

10. The semiconductor memory device according to claim 8, wherein the conductive layer corresponding to the backgate line is disposed on a lower surface of the line-shaped trench.

* * * * *